US008129629B2

(12) United States Patent
Hoppe et al.

(10) Patent No.: US 8,129,629 B2
(45) Date of Patent: Mar. 6, 2012

(54) ARRANGEMENT FOR REDUCING THE FIELD STRENGTH ON AN ELECTRODE

(75) Inventors: Jens Hoppe, Schwarzenbruck (DE); Dietmar Jahnel, Troisdorf (DE); Klaus Müller, Wendelstein (DE); Johann Schlager, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 183 days.

(21) Appl. No.: 12/518,120

(22) PCT Filed: Dec. 6, 2006

(86) PCT No.: PCT/DE2006/002205

§ 371 (c)(1), (2), (4) Date: Jul. 1, 2009

(87) PCT Pub. No.: WO2008/067783

PCT Pub. Date: Jun. 12, 2008

(65) Prior Publication Data

US 2010/0012346 A1 Jan. 21, 2010

(51) Int. Cl.
*H05K 9/00* (2006.01)

(52) U.S. Cl. ........................................ 174/350; 313/613

(58) Field of Classification Search .............. 174/102 R, 174/365

See application file for complete search history.

(56) References Cited

U.S. PATENT DOCUMENTS 2,144,518 A * 1/1939 Westendorp .................. 378/107
2,368,889 A * 2/1945 Setterblade ..................... 315/58
2,443,917 A * 6/1948 Lafferty .......................... 333/33
4,484,047 A 11/1984 Olsen et al.
5,057,742 A * 10/1991 Kawai et al. .................. 313/623
5,619,101 A * 4/1997 Ikedo et al. ................... 313/581
6,432,524 B1 8/2002 Fromm et al.
6,690,111 B1 * 2/2004 Davenport .................... 313/613
7,545,138 B2 * 6/2009 Wilkerson et al. ............ 324/127
2004/0022294 A1 * 2/2004 Yamamori et al. .............. 372/61
2006/0008055 A1 * 1/2006 Sundaram et al. ............ 378/119
2006/0255255 A1 * 11/2006 Miller et al. .................. 250/281
2006/0279271 A1 * 12/2006 Xia et al. ..................... 324/71.1
2007/0296338 A1 * 12/2007 Ito et al. ........................ 313/612
2009/0000805 A1 * 1/2009 Hammer et al. .............. 174/142
2010/0007452 A1 * 1/2010 Forsberg et al. ................ 336/90
2010/0060300 A1 * 3/2010 Muller et al. ................. 324/686

FOREIGN PATENT DOCUMENTS

CN 201562563 U * 8/2010
DE 930402 C 7/1995
GB 2025697 A 1/1980
JP 2001093749 A * 4/2001
SU 1826071 A1 7/1993
UA 73849 C2 3/2005
WO 9822958 A1 5/1998
WO WO 2006016521 A1 * 2/2006

* cited by examiner

*Primary Examiner* — Xiaoliang Chen
*Assistant Examiner* — Nathan Milakovich
(74) *Attorney, Agent, or Firm* — Laurence A. Greenberg; Werner H. Stemer; Ralph E. Locher

(57) ABSTRACT

An arrangement for reducing the electric field strength on the face of an electrode, wherein the face of the electrode is surrounded by at least one electric barrier, and a shielding electrode having a defined voltage potential is disposed in the vicinity of the face of the electrode. By using a retaining element that can be connected directly to the face of the electrode, the shielding wires can be quickly and easily positioned and fixed relative to the face of the electrode and the shielding electrode relative to the face.

13 Claims, 2 Drawing Sheets

ARRANGEMENT FOR REDUCING THE FIELD STRENGTH ON AN ELECTRODE

BACKGROUND OF THE INVENTION

Field of the Invention

The invention relates to an arrangement for reducing the electric field strength on an end face of an electrode, wherein the end face of the electrode is surrounded by at least one electrical barrier and a shielding electrode having a defined electrical voltage potential is arranged in the vicinity of the end electrode.

For shielding from high electric field strengths, at narrow electrical edges on account of the high electric field strengths use is made of so-called shielding wires for reducing the electric field strength. These shielding wires usually arranged singly or doubly reduce the field strength on an in particular narrow electrode. For this purpose, the shielding wire is usually connected to an electrically effective barrier that runs parallel to the shield and likewise serves for fixing the exact position of the shielding wire relative to the electrode.

What is disadvantageous in this case is that high field strengths can nevertheless arise and a connection element between the barrier and the shielding wire is necessary, in which case the connection must be an electrical insulator.

BRIEF SUMMARY OF THE INVENTION

It is an object of the present invention, therefore, to provide a possibility of enabling the shielding electrode to be positioned simply and rapidly relative to the electrode. The object is achieved by means of the features of the independent claims. The invention provides for a holding element to be fitted to the electrode and for the shielding electrode to be positioned and fixed relative to the electrode by the holding element. The use of a holding element that is in mechanical contact directly with the electrode enables a substantially simple and faster positioning of the shielding electrode relative to the end face of the electrode. Advantageously, the holding element is mechanically connected directly to the electrode. Advantageously, the holding element is mechanically connected directly to the electrode.

One advantageous configuration of the invention provides for the holding element to be suitable for receiving a plurality of shielding electrodes. In particular by means of predetermined cutouts within the holding element or by means of corresponding shapings in the form of depressions on the outer side of the holding element, a simple positioning of the shielding electrodes relative to one another and relative to the electrode is possible by means of the holding element.

Advantageously, the holding element is arranged between the electrode and the barrier. Furthermore, it is advantageously provided that the barrier can be fixed to the holding element. The measure ensures that the barrier and the shielding electrodes can be positioned rapidly and simply relative to the end face of the electrode. In order to avoid electrical flashovers and short circuits, the holding element is at least partly produced from an electrical insulation material, in particular a pressboard.

It is advantageously provided that the barrier and/or the shielding electrodes can be inserted into the holding element. By means of this modular construction, the individual segments such as the holding element, the barrier and the shielding electrodes can be produced separately and be inserted one into another by means of a corresponding plug-in mechanism system and thus be positioned relative to one another. As an alternative, it is provided that the barrier and the shielding electrode are fixedly connected to the holding element, such that here the entire unit comprising holding element, shielding electrodes and barriers can be placed as a whole onto the end face of the electrode.

The shielding electrode advantageously has a round or a polygonal cross section, wherein the holding element has a cutout accordingly corresponding to the cross section of the shielding electrode. Furthermore, in order to effectively reduce the field strengths on the end face of the electrode, the shielding electrodes can be arranged symmetrically or asymmetrically relative to the end face of the electrode.

The object is likewise achieved by means of a holding element for retaining a shielding electrode relative to an end face of an electrode, wherein according to the invention it is provided that the holding element can be connected to the electrode and the shielding electrode can thus be positioned and fixed relative to the end face of the electrode.

Advantageously, the shielding electrode can be inserted into the holding element with respect to predeterminable positions. As a result of this, the relative position of the shielding electrodes with respect to one another or relative to the end face of the electrode can already be defined during the production process. Furthermore, the holding element is advantageously composed of an electrical insulation material.

Further advantageous configurations of the invention are described in the dependent claims. The invention is explained in more detail with reference to the following drawings, in which:

DESCRIPTION OF THE INVENTION

Figure 1:
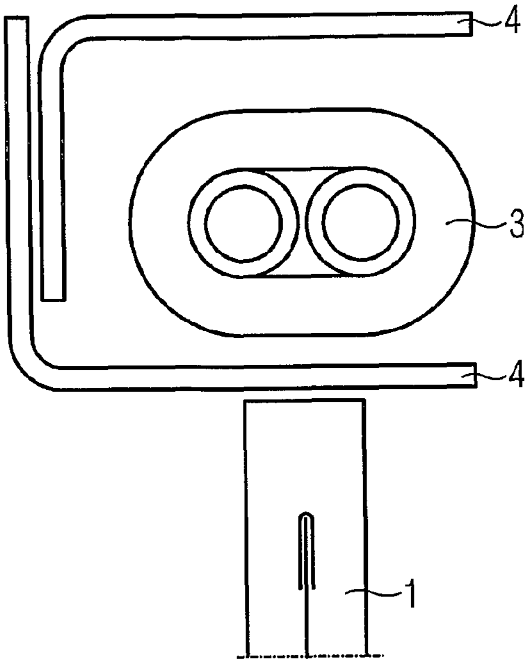
FIG. 1 PRIOR ART
FIG. 1 shows the prior art with regard to previous arrangements for reducing the electric field strength on the end face of an electrode.

FIG. 1 shows, as a sectional drawing, the prior art for an arrangement for reducing the field strength on the end face of an electrode 1 with a doubly embodied shielding wire 3, wherein the shielding wire 3 is fixed above the end face of the electrode 1 on the barriers 4.

Figure 2:
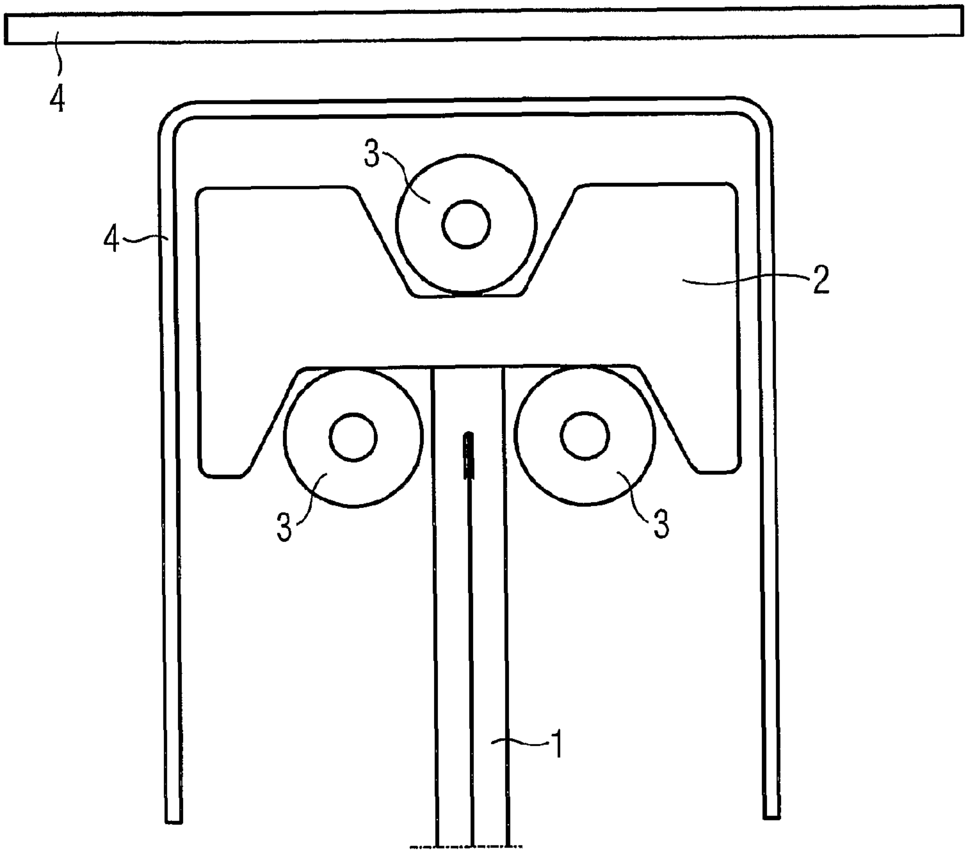
FIG. 2 shows an arrangement according to the invention with three shielding electrode arranged asymmetrically with respect to the end face of an electrode.

In contrast thereto, FIG. 2 shows, as a sectional drawing, a holding element 2 according to the invention, wherein, relative to the end face of the electrode 1, three shielding electrodes 3 are connected to the holding element 2. Furthermore, the holding element 2 serves for retaining the barriers 4, wherein the barrier 4 is now no longer only arranged exclusively on the end face of the electrode 1, but rather can also be arranged along the longitudinal side of the electrode 1. This is possible since the holding element 2 on the end face of the electrode 1 ensures sufficient mechanical stability for a corresponding barrier construction along, at least the upper part of, the electrode 1.

Figure 3:
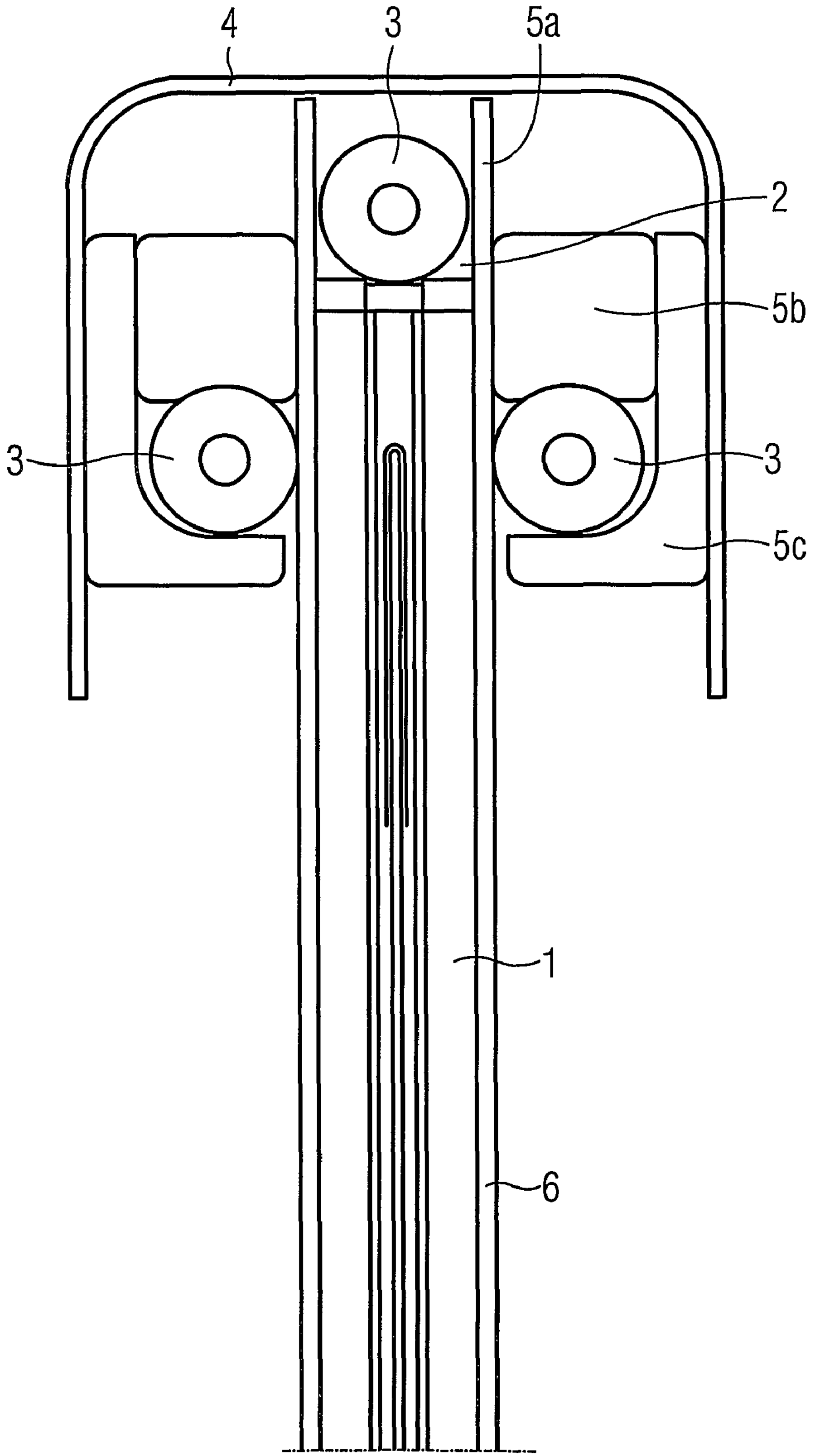
FIG. 3 shows an arrangement according to the invention with a modular construction of the holding element for three shielding electrodes arranged asymmetrically with respect to the end face of an electrode.

FIG. 3 shows an arrangement according to the invention with a modular construction of the holding element 2 for three shielding electrodes 3 arranged asymmetrically with respect to the end face of an electrode 1, as a sectional drawing. The holding element 2 in accordance with FIG. 3 comprises three partial elements 5*a* to 5*c*, which can be modularly connected to one another by means of suitable fixing elements such as, for example, screws or adhesives. By means of the modular construction of the holding element 2, not only is it possible for the shielding wires 3 to be connected to the holding element 2 more easily, but it is possible for the partial elements 5*a* to 5*c* to be produced separately and not to be assembled until at the installation location of the arrangement.

In accordance with the exemplary embodiment in FIG. 3, the holding element 2 comprises two partial elements 5*b* and 5*c* embodied as insulation bodies and one tubular partial element 5*a* as part of an outer wall 6 around the electrode 1. The partial elements 5*b* and 5*c* can either be connected by means of suitable fixing elements, for example by means of screws, or can be plugged together and thus connected to one another by means of suitable surface shapings, for example a tongue-and-groove joint. The same applies to the further tubular partial element 5*a* shown in the sectional drawing in FIG. 3, which can be connected to the rest of the partial elements 5*b* and 5*c* by means of suitable fixing elements and thus forms the holding element 2.

The invention claimed is:

1. An arrangement for reducing the electric field strength on an end face of an electrode, which comprises:

at least one electrical barrier surrounding the end face of the electrode;

a shielding electrode having a defined electrical voltage potential disposed in a vicinity of the end face of the electrode; and a holding element fitted to the electrode, said holding element positioning and fixing said shielding electrode relative to the electrode, said holding element formed of a pressboard;

wherein said electrical barrier is fixable to said holding element.

2. The arrangement according to claim 1, wherein said holding element is configured to receive at least two shielding electrodes.

3. The arrangement according to claim 1, wherein said holding element is disposed between the electrode and said electrical barrier.

4. The arrangement according to claim 1, wherein said electrical barrier is fixed to said holding element.

5. The arrangement according to claim 1, wherein said shielding electrode is electrically connected to the electrode.

6. The arrangement according to claim 1, wherein at least one of said electrical barrier and said shielding electrode is insertible into said holding element.

7. The arrangement according to claim 1, wherein at least one of said electrical barrier and said shielding electrode is fixedly connected to said holding element.

8. The arrangement according to claim 1, wherein said shielding electrode has a round or polygonal cross section.

9. The arrangement according to claim 1, wherein said shielding electrode is one of at least two shielding electrodes arranged symmetrically relative to the end face of the electrode.

10. The arrangement according to claim 1, wherein said shielding electrode is one of at least two shielding electrodes arranged asymmetrically relative to the end face of the electrode.

11. A holding element for retaining a shielding electrode relative to an end face of an electrode, comprising:

the holding element being configured for connection to the electrode and for positioning and fixing the shielding electrode relative to the end face of the electrode;

the holding element formed of a pressboard;

the holding element being composed of and assembled from partial elements; and fixing elements for connecting said partial elements to one another.

12. The holding element according to claim 11, wherein the holding element is configured to enable the shielding electrode to be inserted thereinto with respect to predeterminable positions.

13. The holding element according to claim 11, wherein the holding element comprises an electrical insulation material.

* * * * *